United States Patent
Tolle

(10) Patent No.: US 9,396,934 B2
(45) Date of Patent: Jul. 19, 2016

(54) METHODS OF FORMING FILMS INCLUDING GERMANIUM TIN AND STRUCTURES AND DEVICES INCLUDING THE FILMS

(71) Applicant: ASM IP Holding B.V., Almere (NL)

(72) Inventor: John Tolle, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 258 days.

(21) Appl. No.: 13/966,782

(22) Filed: Aug. 14, 2013

(65) Prior Publication Data
US 2015/0048485 A1 Feb. 19, 2015

(51) Int. Cl.
| | | |
|---|---|---|
| *H01L 21/02* | (2006.01) | |
| *H01L 29/161* | (2006.01) | |
| *H01L 29/165* | (2006.01) | |
| *C30B 25/18* | (2006.01) | |
| *C30B 29/52* | (2006.01) | |

(52) U.S. Cl.
CPC ........ *H01L 21/02532* (2013.01); *C30B 25/183* (2013.01); *C30B 29/52* (2013.01); *H01L 21/0262* (2013.01); *H01L 21/02535* (2013.01); *H01L 21/02576* (2013.01); *H01L 21/02579* (2013.01); *H01L 29/161* (2013.01); *H01L 29/165* (2013.01)

(58) Field of Classification Search
CPC ..................... H01L 21/02532; H01L 21/0262; H01L 21/02535; H01L 29/161; H01L 29/165
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,145,699 A * | 3/1979 | Hu et al. ........................ 257/35 |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Final Office Action dated Jul. 14, 2014 in U.S. Appl. No. 12/754,223.

(Continued)

*Primary Examiner* — Bac Au
*Assistant Examiner* — Toniae Thomas
(74) *Attorney, Agent, or Firm* — Snell & Wilmer LLP

(57) ABSTRACT

Methods of forming germanium-tin films using germane as a precursor are disclosed. Exemplary methods include growing films including germanium and tin in an epitaxial chemical vapor deposition reactor, wherein a ratio of a tin precursor to germane is less than 0.1. Also disclosed are structures and devices including germanium-tin films formed using the methods described herein.

20 Claims, 7 Drawing Sheets

(56) References Cited

U.S. PATENT DOCUMENTS

| | | |
|---|---|---|
| 4,393,013 A | 7/1983 | McMenamin |
| 4,436,674 A | 3/1984 | McMenamin |
| 4,499,354 A | 2/1985 | Hill et al. |
| 4,512,113 A | 4/1985 | Budinger |
| 4,570,328 A | 2/1986 | Price et al. |
| D288,556 S | 3/1987 | Wallgren |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,986,215 A | 1/1991 | Yamada |
| 4,991,614 A | 2/1991 | Hammel |
| 5,062,386 A | 11/1991 | Christensen |
| 5,074,017 A | 12/1991 | Toya et al. |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,421,893 A | 6/1995 | Perlov |
| 5,422,139 A | 6/1995 | Shinriki et al. |
| 5,518,549 A | 5/1996 | Hellwig |
| 5,595,606 A | 1/1997 | Fujikawa et al. |
| 5,616,947 A | 4/1997 | Tamura |
| 5,632,919 A | 5/1997 | MacCracken et al. |
| 5,681,779 A | 10/1997 | Pasch et al. |
| 5,695,567 A | 12/1997 | Kordina |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,035,101 A | 3/2000 | Sajoto et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,160,244 A | 12/2000 | Ohashi |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 | 5/2003 | Arai et al. |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,645,304 B2 | 11/2003 | Yamaguchi |
| 6,648,974 B1 | 11/2003 | Ogliari et al. |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,238,596 B2 * | 7/2007 | Kouvetakis et al. .......... 438/507 |
| D553,104 S | 10/2007 | Oohashi et al. |
| 7,298,009 B2 | 11/2007 | Yan et al. |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,431,966 B2 | 10/2008 | Derderian et al. |
| 7,437,060 B2 | 10/2008 | Wang et al. |
| 7,442,275 B2 | 10/2008 | Cowans |
| 7,489,389 B2 | 2/2009 | Shibazaki |
| D593,969 S | 6/2009 | Li |
| 7,547,363 B2 | 6/2009 | Tomiyasu et al. |
| 7,575,968 B2 | 8/2009 | Sadaka et al. |
| 7,589,003 B2 * | 9/2009 | Kouvetakis et al. .......... 438/507 |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |
| 7,723,648 B2 | 5/2010 | Tsukamoto et al. |

(56) References Cited

U.S. PATENT DOCUMENTS

| | | |
|---|---|---|
| 7,740,705 B2 | 6/2010 | Li |
| 7,780,440 B2 | 8/2010 | Shibagaki et al. |
| 7,833,353 B2 | 11/2010 | Furukawahara et al. |
| 7,838,084 B2 | 11/2010 | Derderian et al. |
| 7,851,019 B2 | 12/2010 | Tuominen et al. |
| 7,884,918 B2 | 2/2011 | Hattori |
| D634,719 S | 3/2011 | Yasuda et al. |
| 8,041,197 B2 | 10/2011 | Kasai et al. |
| 8,055,378 B2 | 11/2011 | Numakura |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,444,120 B2 | 5/2013 | Gregg et al. |
| 8,506,713 B2 | 8/2013 | Takagi |
| D691,974 S | 10/2013 | Osada et al. |
| 8,608,885 B2 | 12/2013 | Goto et al. |
| 8,683,943 B2 | 4/2014 | Onodera et al. |
| 8,711,338 B2 | 4/2014 | Liu et al. |
| D705,745 S | 5/2014 | Kurs et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| D716,742 S | 11/2014 | Jang et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,029,253 B2 | 5/2015 | Milligan et al. |
| 9,096,931 B2 | 8/2015 | Yednak et al. |
| 9,196,483 B1 * | 11/2015 | Lee ................ H01L 21/02667 |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0141820 A1 | 7/2003 | White et al. |
| 2003/0168001 A1 | 9/2003 | Sneh |
| 2003/0180458 A1 | 9/2003 | Sneh |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0101622 A1 | 5/2004 | Park et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0123690 A1 | 6/2005 | Derderian et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2005/0287725 A1 | 12/2005 | Kitagawa |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0163612 A1 * | 7/2006 | Kouvetakis et al. .......... 257/201 |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020891 A1 * | 1/2007 | Kouvetakis et al. .......... 438/479 |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |

(56) References Cited

U.S. PATENT DOCUMENTS

| | | |
|---|---|---|
| 2007/0084405 A1 | 4/2007 | Kim |
| 2007/0096194 A1* | 5/2007 | Streck et al. ................ 257/315 |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1* | 10/2008 | Chui et al. ................ 257/14 |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0159638 A1* | 6/2010 | Jeong ................ H01L 27/24 438/102 |
| 2010/0162752 A1 | 7/2010 | Tabata et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0254052 A1* | 10/2011 | Kouvetakis et al. .......... 257/190 |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1* | 12/2012 | Bedell et al. ................ 136/255 |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1* | 10/2013 | Sanchez et al. ............ 257/616 |
| 2013/0264659 A1 | 10/2013 | Jung |
| 2013/0288480 A1* | 10/2013 | Sanchez ............ H01L 21/02532 438/694 |
| 2013/0292676 A1 | 11/2013 | Milligan et al. |
| 2013/0292807 A1 | 11/2013 | Raisanen et al. |
| 2013/0330911 A1* | 12/2013 | Huang et al. ................ 438/478 |
| 2014/0000843 A1 | 1/2014 | Dunn et al. |
| 2014/0014644 A1 | 1/2014 | Akiba et al. |
| 2014/0020619 A1* | 1/2014 | Vincent et al. ................ 117/88 |
| 2014/0027884 A1 | 1/2014 | Tang et al. |
| 2014/0036274 A1 | 2/2014 | Marquardt et al. |
| 2014/0048765 A1* | 2/2014 | Ma ........................ H01L 29/78 257/12 |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1* | 3/2014 | Roucka et al. ................ 257/98 |
| 2014/0084341 A1 | 3/2014 | Weeks |
| 2014/0087544 A1* | 3/2014 | Tolle ........................ 438/478 |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0225065 A1* | 8/2014 | Rachmady et al. ............ 257/24 |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0014632 A1* | 1/2015 | Kim ........................ 257/24 |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0167159 A1 | 6/2015 | Halpin et al. |
| 2015/0184291 A1 | 7/2015 | Alokozai et al. |
| 2015/0187568 A1 | 7/2015 | Pettinger et al. |

FOREIGN PATENT DOCUMENTS

| | | |
|---|---|---|
| CN | 101522943 | 9/2009 |
| CN | 101423937 | 9/2011 |

(56) References Cited

FOREIGN PATENT DOCUMENTS

| EP | 2036600 | 3/2009 |
|---|---|---|
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |
| TW | 200701301 | 1/2007 |
| WO | 2006/056091 | 6/2006 |
| WO | 2006/078666 | 7/2006 |

OTHER PUBLICATIONS

USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.

(56) References Cited

OTHER PUBLICATIONS

USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
USPTO; Restriction Requirement dated May 8, 2014 in U.S. Appl. No. 13/791,246.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 02, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).

* cited by examiner

METHODS OF FORMING FILMS INCLUDING GERMANIUM TIN AND STRUCTURES AND DEVICES INCLUDING THE FILMS

FIELD OF INVENTION

The present disclosure generally relates to techniques for depositing films including germanium tin and to structures and devices including such films. More particularly, the disclosure relates to methods of forming films comprising germanium tin using germane as a precursor, to methods of forming structures and devices including the films, and to structures and devices including the films.

BACKGROUND OF THE DISCLOSURE

Various electronic devices, such as semiconductor devices, and photonic devices, such as lasers and solar devices, may include or may desirably include germanium-tin layers, such as GeSn, GeSiSn, and the like. For example, GeSn layers can be used to form direct band gap devices and/or may be used to provide strain in an adjacent germanium layer to increase mobility in the germanium layer. Similarly, GeSiSn layers can be used to form tunable band gap devices as well as optical devices having tunable optical properties. To obtain the desired device properties, the germanium-tin films generally have a crystalline structure, which generally follows the crystalline structure of the underlying layer.

GeSn layers may be deposited or grown using a variety of techniques. For example, vacuum processes, including molecular beam epitaxy and ultra-high vacuum chemical vapor deposition, have been used to form GeSn films. The germanium precursor for such processes typically includes digermane ($Ge_2H_6$) or trigermane ($Ge_3H_8$). When the film includes silicon, the silicon precursor may include a disilane, trisilane, or other higher order silane compounds, or heteronuclear Si—Ge compounds with the general formula of $(H_3Ge)_xSiH_{4-x}$ (x=1-4), $(H_3Si)_xGeH_{4-x}$ (x=1-4).

Although such processes have been used to deposit or grow crystalline GeSn and GeSiSn layers, use of digermane, trigermane, or higher order germane precursors, is problematic in several respects. For example, formation of films or layers including GeSn using digermane or higher order germane precursors, such as trigermane, is not selective when certain carrier gasses (e.g., hydrogen) and/or dopants (e.g., p-type dopants) are used with the precursor. Also, digermane is relatively unstable (explosive) in concentrated form; as a result, an amount of the precursor contained in a vessel may be limited, typically to less than 154 grams, which in turn, causes throughput of processes using such a precursor to be relatively low. In addition, digermane and higher order germanes are relatively expensive. Accordingly, improved processes for forming crystalline films including GeSn are desired.

SUMMARY OF THE DISCLOSURE

Various embodiments of the present disclosure relate to methods of forming GeSn films and to structures and devices including the films. The films formed using the methods described herein may be used, for example, for semiconductor, direct band gap, photonic, or any device including the film. While the ways in which various embodiments of the disclosure address the drawbacks of the prior art methods are discussed in more detail below, in general, the disclosure provides methods of forming germanium-tin layers (e.g., crystalline), using a germane ($GeH_4$) precursor, on a surface of a substrate and structures and devices including such films.

As used herein, germanium-tin (GeSn) layers (also referred to herein as films) or layers including germanium and tin are layers that include the elements germanium and tin. The layers may include additional elements, such as silicon (e.g., GeSnSi).

In accordance with various embodiments of the disclosure, methods of forming a layer including GeSn includes the steps of providing a gas-phase reactor, providing a germane precursor source coupled to the gas-phase reactor, providing a tin precursor source coupled to the gas-phase reactor, providing a substrate within a reaction chamber of the gas-phase reactor, providing a germane precursor and a tin precursor to the reaction chamber, and forming (e.g., epitaxially growing) a crystalline layer of germanium tin on a surface of the substrate. In accordance with various aspects of these embodiments, the step of providing a germane precursor and a tin precursor to the reaction chamber includes providing a mixture of the tin precursor and the germane precursor having a volumetric ratio of tin precursor to germane of about 0.001 to about 0.1, about 0.005 to about 0.05, less than about 0.1, or less than about 0.05. A reaction chamber temperature and pressure during the step of forming a crystalline layer of germanium tin may vary in accordance with various factors. Exemplary reaction chamber temperatures range from about 200° C. to about 500° C., about 250° C. to about 450° C., or about 300° C. to about 420° C. Exemplary reaction chamber pressures during this step range from about 1 Torr to about 760 Torr, about 10 Torr to about 760 Torr, or about 50 Torr to about 760 Torr. In accordance with further aspects of these embodiments, the germanium-tin layer includes silicon. In these cases, the method further comprises a step of providing a silicon source precursor to the reaction chamber. Exemplary silicon source precursors include disilane, trisiliane, tetrasilane, neopentasilane, and higher order silane compounds. An amount of tin incorporated into the crystalline germanium-tin layer may be about greater than 1 at %, greater than 2 at %, or greater than 5 at %, or range from about 0 at % to about 15 at % tin, about 2 at % to about 15 at % tin, about 0.2 at % to about 5 at % tin, or about 0.2 at % to about 15 at % tin. When the layer of crystalline germanium-tin includes silicon, the layer may include greater than 0 at % silicon, greater than about 1 at % silicon, or between about 1 at % silicon and about 20 at % silicon, about 2 at % silicon and about 16 at % silicon, or about 4 at % silicon and about 12 at % silicon. In accordance with further aspects of these embodiments, the substrate includes silicon. In accordance with other aspects, the substrate includes a layer of germanium—e.g., overlying silicon. Exemplary methods in accordance with these embodiments additionally include the steps of forming an insulating layer overlying the substrate, forming a via within the insulating layer, and forming (e.g., selectively) the (e.g., crystalline) layer of a germanium tin within the via and overlying the substrate, which may include one or more previously formed layers.

In accordance with further exemplary embodiments of the disclosure, a method of forming a structure comprising a germanium-tin (e.g., crystalline) layer includes the steps of providing a gas-phase reactor, providing a substrate within a reaction chamber of the gas-phase reactor, and forming a layer comprising germanium tin (e.g., crystalline) on a surface of the substrate using one or more precursors comprising germane ($GeH_4$). In accordance with various aspects of these embodiments, the step of forming a layer comprising germanium tin includes providing a mixture of a tin precursor and the germane having a volumetric ratio of tin precursor to germane of about 0.001 to about 0.1, about 0.005 to about 0.05, less than about 0.1, or less than about 0.05. In accordance with further aspects, a reaction chamber temperature during the step of forming a crystalline layer comprising germanium tin ranges from about 200° C. to about 500° C., about 250° C. to about 450° C., or about 300° C. to about 420° C. In accordance with yet further aspects, a reaction chamber pressure during the step of forming a layer comprising germanium tin ranges from about 1 Torr to about 760 Torr, about 10 Torr to about 760 Torr, or about 50 Torr to about 760 Torr. In accordance with yet further aspects of these embodiments, the step of forming a layer comprising germanium tin includes forming a layer comprising silicon germanium tin. In these cases, a silicon precursor is provided to the reaction chamber. Exemplary silicon source precursors include disilane, trisiliane, tetrasilane, neopentasilane, and higher order silane compounds. An amount of tin incorporated into the germanium-tin layer may be about greater than 1 at %, greater than 2 at %, or greater than 5 at %, or range from about 0 at % to about 15 at % tin, about 2 at % to about 15 at % tin, about 0.2 at % to about 5 at % tin, or about 0.2 at % to about 15 at % tin. When the layer of crystalline germanium-tin layer includes silicon, the layer may include greater than 0 at % silicon, greater than about 1 at % silicon, or between about 1 at % silicon and about 20 at % silicon, about 2 at % silicon and about 16 at % silicon, or about 4 at % silicon and about 12 at % silicon. In accordance with various aspects of these embodiments, the substrate includes silicon. In accordance with other aspects, the substrate includes a layer of germanium—e.g., overlying silicon. Exemplary methods in accordance with these embodiments additionally include the steps of forming an insulating layer overlying the substrate, forming a via within the insulating layer, and forming (e.g., selectively) the layer of germanium tin within the via and overlying the substrate.

In accordance with yet further embodiments of the disclosure, a structure includes a crystalline germanium-tin layer formed in accordance with a method of the present disclosure. The structure may be used to form electronic (e.g., semiconductor) or photonic (e.g., solar or light-emitting) devices.

And in accordance with yet additional exemplary embodiments of the disclosure, a device includes a crystalline germanium-tin layer formed in accordance with a method of the present disclosure.

BRIEF DESCRIPTION OF THE DRAWING FIGURES

A more complete understanding of exemplary embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure

DETAILED DESCRIPTION OF EXEMPLARY EMBODIMENTS OF THE DISCLOSURE

The description of exemplary embodiments of methods, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure relates, generally, to methods of forming layers, such as a crystalline layer, including germanium and tin, overlying a substrate. The germanium-tin layers may include additional elements, such as silicon, which form part of a crystalline lattice with the germanium-tin layer.

As used herein, a "substrate" refers to any material having a surface onto which material can be deposited. A substrate may include a bulk material such as silicon (e.g., single crystal silicon, single crystal germanium, or other semiconductor wafer) or may include one or more layers overlying the bulk material. Further, the substrate may include various topologies, such as trenches, vias, lines, and the like formed within or on at least a portion of a layer of the substrate. Exemplary substrates include a silicon wafer, a layer comprising germanium overlying silicon, and a layer comprising germanium silicon tin overlying silicon.

Figure 1:
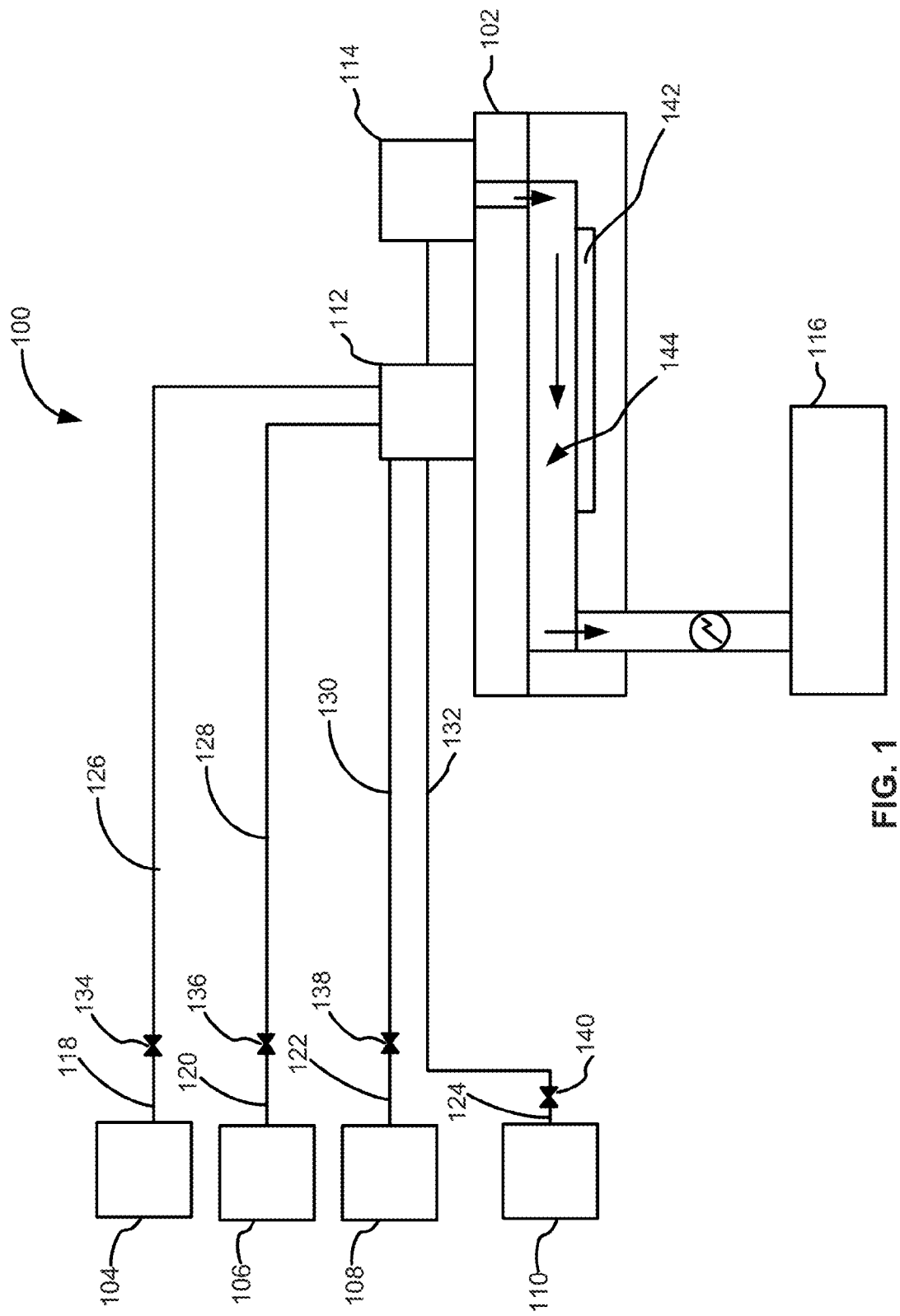
FIG. 1 illustrates a system for forming a layer of crystalline germanium tin in accordance with exemplary embodiments of the disclosure.

FIG. 1 illustrates a system 100 suitable for forming germanium-tin using the methods described herein. In the illustrated example, system 100 includes a reactor 102, a germane precursor source 104, a tin precursor source 106, an optional third precursor source 108 (e.g., for inclusion of silicon or other element(s) in a formed layer). a purge and/or carrier gas source 110, an optional mixer 112, an optional intake plenum 114, and a vacuum source 116. Sources 104-110 may be coupled to mixer 112 or reactor 102 using lines 118-132 and valves 134-140. Although not illustrated, a system, such as system 100, may include additional sources and corresponding delivery lines for dopants (e.g., n-type dopants such as phosphorous or arsenic or p-type dopants such as boron). Additionally or alternatively, the dopants may be included in one or more of the precursor sources 102-108.

Reactor 102 may be a standalone reactor or part of a cluster tool. Further, reactor 102 may be dedicated to a particular process, such as a deposition process, or reactor 102 may be used for other processes—e.g., for layer passivation and/or etch processing. For example, reactor 102 may include a reactor typically used for epitaxial chemical vapor deposition (CVD) processing, such as an Epsilon® 2000 Plus, available from ASM, and may include direct plasma, and/or remote plasma apparatus (not illustrated) and/or various heating systems, such as radiant, inductive, and/or resistive heating systems (also not illustrated). Using a plasma may enhance the reactivity of one or more precursors. The illustrated reactor is a single-substrate, horizontal-flow reactor, which enables laminar flow of reactants over a substrate 142, with low residence times, which in turn facilitates relatively rapid sequential substrate processing. An exemplary CVD reactor suitable for system 100 is described in U.S. Pat. No. 7,476,627, issued to Pomarede et al. on Jan. 13, 2009, the contents of which are hereby incorporated herein by reference, to the extent such contents do not conflict with the present disclosure. Although illustrated as a horizontal-flow reactor, reactor 102 in accordance with alternative embodiments may include a vertical flow, for example, flow emanating from a showerhead and flowing substantially downward onto a substrate.

An operating pressure of a reaction chamber 144 of reactor 102 may vary in accordance with various factors. Reactor 102 may be configured to operate at near atmospheric pressure or at lower pressures. By way of examples, an operating pressure of reactor 102 during layer formation steps ranges from about 1 Torr to about 760 Torr, about 10 Torr to about 760 Torr, or about 50 Torr to about 760 Torr.

Source 104 includes germane ($GeH_4$) and may optionally include one or more dopant compounds, such as compounds typically used to fabricate photonic and/or semiconductor devices. Exemplary p-type dopant compounds include $B_2H_6$ and exemplary n-type dopant compounds include $AsH_3$.

Use of germane is advantageous over other precursors, such as digermane, trigermane, and other higher-order germanes, used to form germanium-tin layers, because germane is relatively selective when mixed with various carrier gasses (e.g., hydrogen, nitrogen, or the like) and is also relatively selective, even when dopants (e.g., p-type dopants) are used with the precursor. Also, germane is relatively safe, compared to higher order digermanes, and thus can be used and/or transported in higher quantities, compared the higher order germanes. Also, germane is used as a precursor for other layers, such as germanium, and is more readily available and is less expensive, compared to higher-order germane compounds.

Tin precursor source 106 includes any compound suitable for providing tin to a germanium-tin layer. Exemplary tin precursors include tin chloride ($SnCl_4$), deuterated stannane ($SnD_4$), and methyl and/or halide substituted stannanes, such as compounds having a formula $Sn(CH_3)_{4-n}X_n$, in which X is H, D (deuterium), Cl, or Br and n is 0, 1, 2, or 3; $ZSn(CH_3)_{3-n}X_n$ in which Z is H or D, X is Cl or Br, and n is 0, 1, or 2; $Z_2Sn(CH_3)_{2-n}X_n$ in which Z is H or D, X is Cl or Br, and n is 0 or 1; or $SnBr_4$. Some exemplary tin precursors suitable for use with the present disclosure are discussed in more detail in application Ser. No. 13/783,762, filed Mar. 4, 2013, entitled TIN PRECURSORS FOR VAPOR DEPOSITION AND DEPOSITION PROCESSES, the contents of which are hereby incorporated herein by reference, to the extent such contents do not conflict with the present disclosure.

Optional third precursor source 108, when used, includes a precursor for additional elements or compounds that may be included in a deposited layer. For example, precursor source 108 may include a silicon precursor, such as disilane, trisilane, tetrasilane, neopentasilane, and higher order silanes, or may include one or more compounds suitable as a dopant precursor/compound. If source 108 includes a silicon precursor, then, as noted above, system 100 may include additional dopant sources and corresponding supply lines.

Gas source 110 may include any suitable purge or carrier gas. Exemplary gasses suitable as carrier and purge gasses include nitrogen, argon, helium, and hydrogen.

System 100 may include a gas distribution system. An exemplary gas distribution system, which allows for fast switching between gasses (e.g., from sources 104-110) is set forth U.S. Pat. No. 8,152,922 to Schmidt et al., issued Apr. 10, 2012, entitled "Gas Mixer and Manifold Assembly for ALD Reactor," the contents of which are hereby incorporated herein by reference, to the extent the contents do not conflict with the present disclosure. The gas distribution system may be used to, for example, mix one or more precursor gasses and a carrier gas (which may be the same or different from a purge gas from gas source 108) prior to the gasses reaching plenum 114 or reactor 102.

Figure 2:
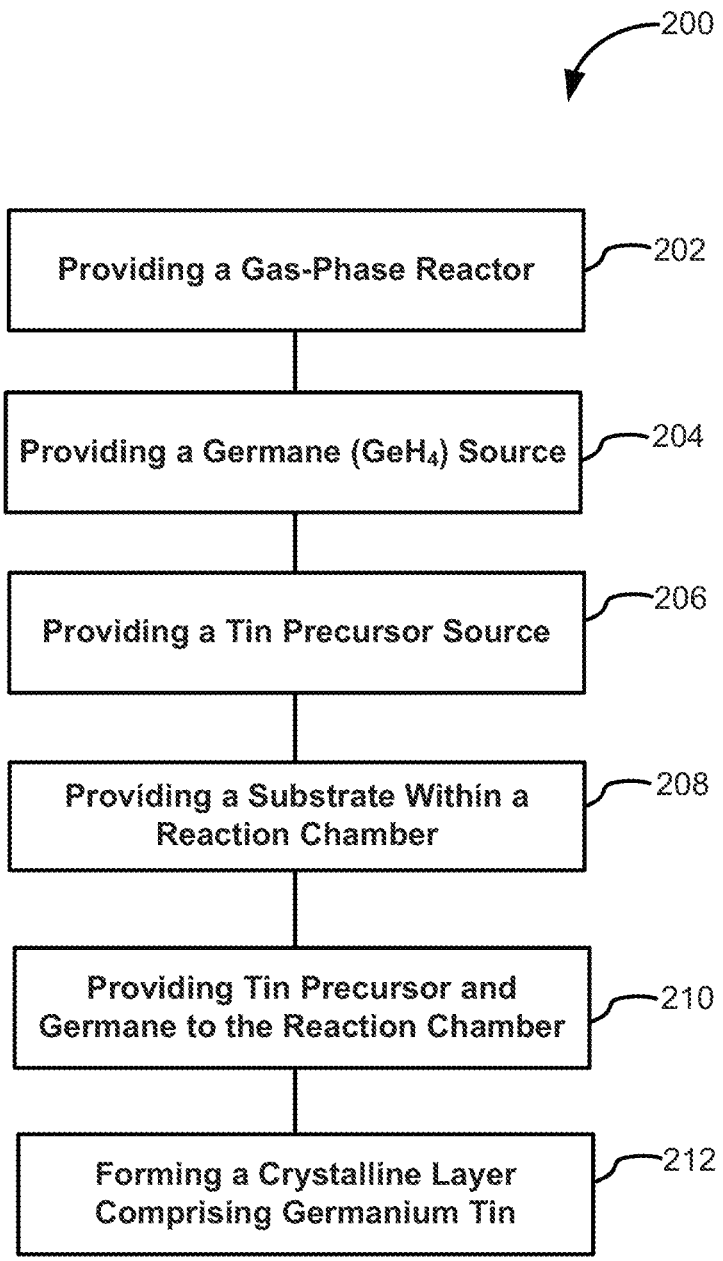
FIG. 2 illustrates a method of forming a layer comprising germanium tin in accordance with further exemplary embodiments of the disclosure.

Turning now to FIG. 2, an exemplary method 200 of forming a crystalline germanium-tin layer is illustrated. Method 200 includes the steps of providing a gas-phase reactor (step 202), providing a germane source coupled to the gas-phase reactor (step 204), providing a tin precursor source coupled to the gas-phase reactor (step 206), providing a substrate within a reaction chamber of the gas-phase reactor (step 208), providing germane and a tin precursor to the reaction chamber, wherein a ratio of the tin precursor to the germane is less than 0.1 (step 210), and forming a crystalline layer of germanium tin on a surface of the substrate (step 212).

During step 202, a gas-phase reactor, such as a CVD reactor suitable for epitaxial growth is provided. The reactor may be a single-substrate, laminar flow reactor. Such reactors are available from ASM, such as the Epsilon® 2000 Plus.

During steps 204 and 206, suitable germane ($GeH_4$) and tin precursor sources are coupled to the reactor. As noted above, the germane source may include dopant compounds, such as p-type dopant compounds. Or, dopants may be supplied from additional sources (not illustrated). The tin precursor source may include, for example, tin chloride and/or tin deuteride and/or other tin precursors noted herein.

During step 208, a substrate is loaded into a reaction chamber of a reactor. The substrate may be received from a loading load lock of a reactor system and transported to the reaction chamber using a suitable transfer mechanism.

At step 210, the tin precursor and germane are provided to a reaction chamber of a reactor. The tin precursor and germane may be mixed (e.g., at mixer 112) prior to entering the chamber. Additionally, the germane and tin precursor may be individually or in combination mixed with one or more carrier gasses. The germane and/or tin precursor may be mixed with a carrier upstream of the reaction chamber, such as at a mixer, or upstream of a mixer.

As noted above, use of germane has several advantages over use of typical precursors used to form layers including germanium and tin. It was surprisingly and unexpectedly found that using relatively high partial pressures of germane relative to the tin precursor formed high-quality, crystalline germanium-tin layers. In accordance with various aspects of exemplary embodiments of the disclosure, the step of providing germane and a tin precursor to the reaction chamber includes providing a mixture of a tin precursor and the germane having a volumetric ratio of tin precursor to germane of about 0.001 to about 0.1, about 0.005 to about 0.05, less than about 0.1, or less than about 0.05.

During step 212, a crystalline layer (e.g., an epitaxial layer) is formed overlying a substrate. Exemplary reaction chamber temperatures during step 212 may range from about 200° C. to about 500° C., about 250° C. to about 450° C., or about 300° C. to about 420° C. And, exemplary reaction chamber pressures during this step may range from about 1 Torr to about 760 Torr, about 10 Torr to about 760 Torr, or about 50 Torr to about 760 Torr.

Step 212 may include forming a layer comprising germanium silicon tin. In these cases, a silicon precursor is provided to the reaction chamber. Exemplary silicon source precursors include disilane, trisiliane, tetrasilane, neopentasilane, and higher order silane compounds. The silicon precursor or other suitable precursor may be mixed with a carrier gas and optionally mixed with one or more other precursors as described herein.

Method 200 may also include steps of forming an insulating layer overlying a substrate and forming a via within the insulating layer. Exemplary techniques of forming an insulating layer and a via within the insulating layer are described in more detail below. In these cases, the germanium-tin layer may be selectively formed on the substrate within the via, as described below.

Figure 3:
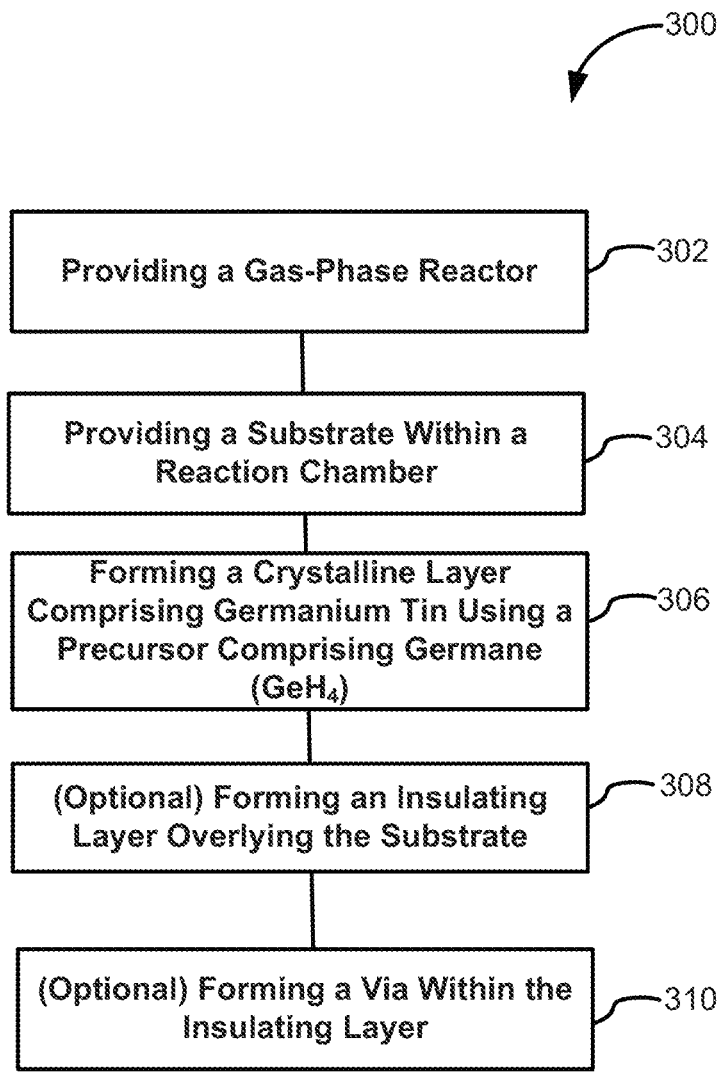
FIG. 3 illustrates another method of forming a layer comprising germanium tin in accordance with exemplary embodiments of the disclosure.

FIG. 3 illustrates another method 300 in accordance with additional embodiments of the disclosure. Method 300 includes the steps of providing a gas-phase reactor (step 302), providing a substrate within a reaction chamber of the gas-phase reactor (step 304), and forming a crystalline layer comprising germanium tin on a surface of the substrate using one or more precursors comprising germane (step 306).

During step 302, a reactor suitable for growing a crystalline layer comprising germanium tin is provided. The reactor may include any reactor described herein, such as a horizontal-flow epitaxial CVD reactor.

During step 304, a substrate is provided within a reaction chamber of a reactor. Step 304 may be the same as or similar to step 208 of method 200.

At step 308, a crystalline layer comprising germanium tin is formed. In accordance with various aspects of exemplary embodiments of the disclosure, the step of forming a layer comprising germanium tin includes providing a mixture of a tin precursor and the germane having a volumetric ratio of tin precursor to germane of about 0.001 to about 0.1, about 0.005 to about 0.05, less than about 0.1, or less than about 0.05. In accordance with further aspects, a reaction chamber temperature during the step of forming a crystalline layer comprising germanium tin ranges from about 200° C. to about 500° C., about 250° C. to about 450° C., or about 300° C. to about 420° C. And, in accordance with yet further aspects, a reaction chamber pressure during the step of forming a layer comprising germanium tin ranges from about 1 Torr to about 760 Torr, about 10 Torr to about 760 Torr, or about 50 Torr to about 760 Torr.

Step 306 may include forming a layer comprising silicon germanium tin. In these cases, a silicon precursor is provided to the reaction chamber. Exemplary silicon source precursors include disilane, trisiliane, tetrasilane, neopentasilane, and higher order silane compounds.

Method 300 may also include optional steps 308 and 310 of forming an insulating layer overlying a substrate (step 308) and forming a via within the insulating layer. During step 308, any suitable insulating layer, such as silicon oxide or silicon nitride may be deposited onto the substrate. Then, during step 310, one or more vias may be formed within the insulating layer. Reactive ion etching or other suitable technique may be used to form the one or more vias.

In the cases where steps 308 and 310 are performed, the crystalline layer formed during step 306 may be selectively formed within the vias. As noted above, use of a germane precursor is advantageous because it is relatively selective when using a variety of carrier gasses, such as hydrogen and when the layer includes one or more dopants, such as p-type dopants.

The layers formed using method 200 or method 300 (e.g., during steps 212 or 306) may include, for example, greater than 1 at %, greater than 2 at %, or greater than 5 at %, or between about 0 at % and about 15 at % tin, about 2 at % and about 15 at % tin, about 0.2 at % and about 5 at % tin, or about 0.2 at % and about 15 at % tin. When the layer of crystalline germanium tin includes silicon, the layer may include greater than 0 at % silicon, greater than about 1 at % silicon, or between about 1 at % silicon and about 20 at % silicon, about 2 at % silicon and about 16 at % silicon, or about 4 at % silicon and about 12 at % silicon.

Figure 4:
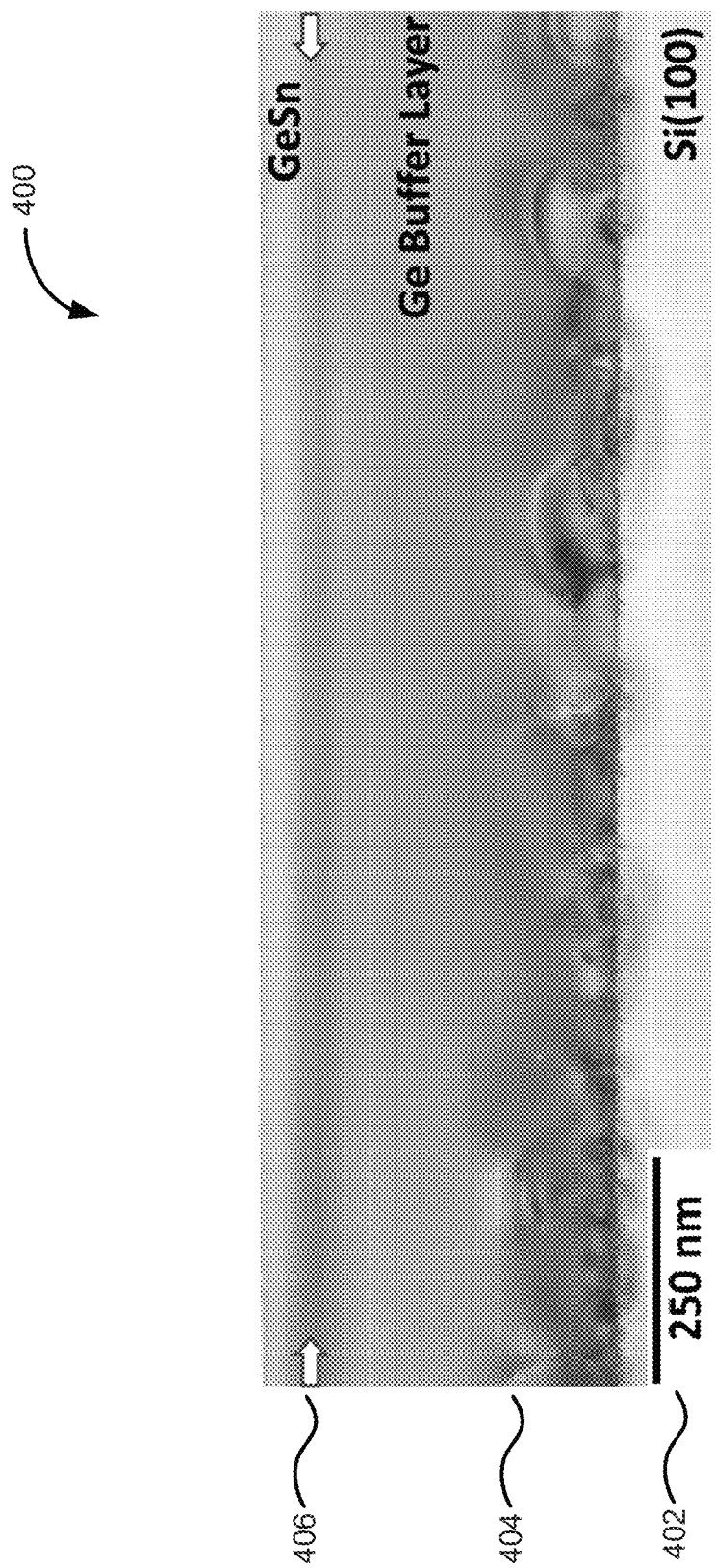
FIG. 4 illustrates a structure in accordance with exemplary embodiments of the disclosure.

FIG. 4 illustrates a transmission electron microscope image of a structure 400 formed in accordance with various embodiments of the invention, such as method 200 or method 300. Structure 400 includes a silicon substrate 402, a germanium buffer layer 404 overlying substrate 402, and a germanium-tin layer 406 formed using germane as a precursor. In the illustrated example, layer 406 includes about 8 at % tin. No threading defects were observed in the illustrated structure.

Figure 5:
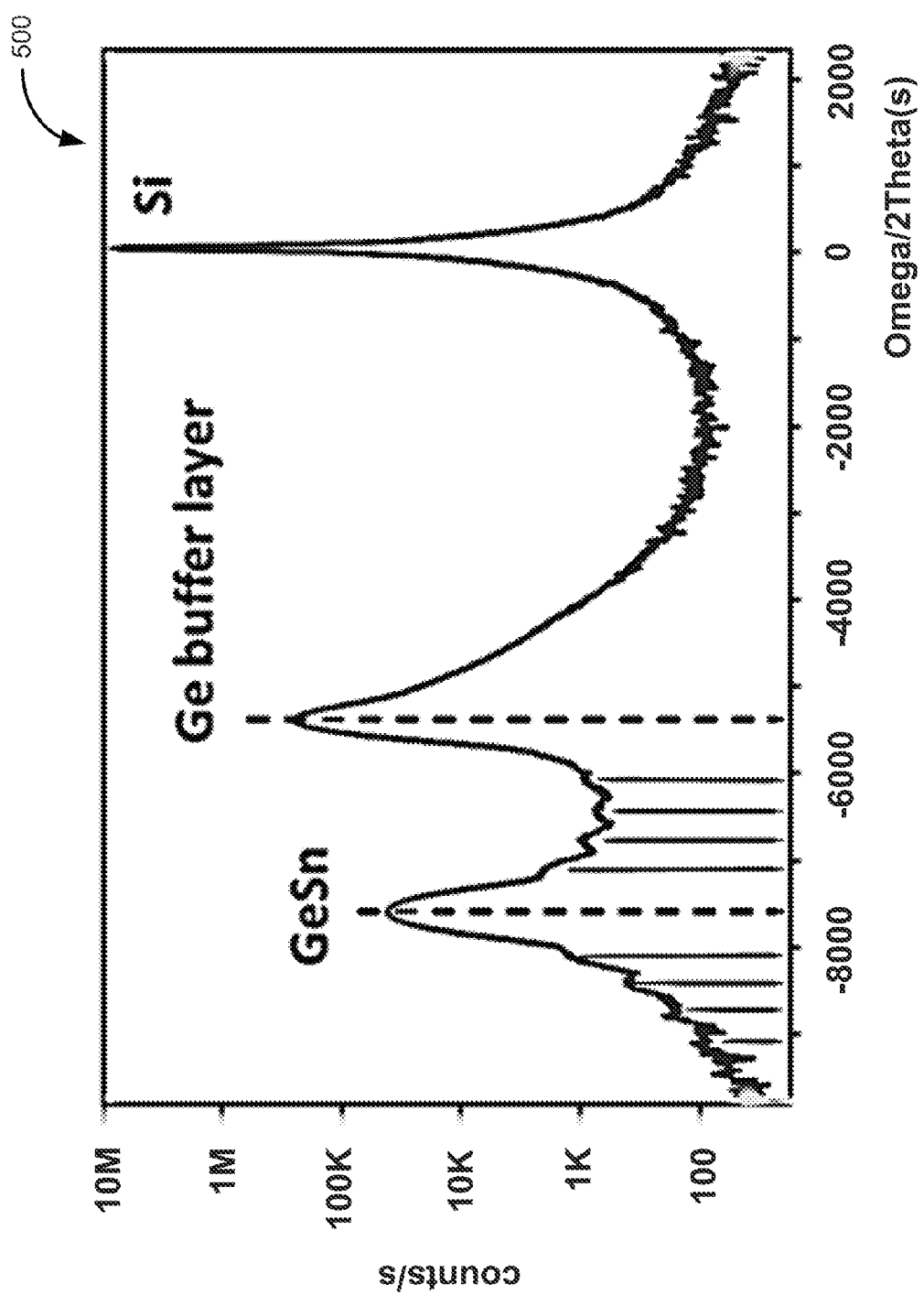
FIG. 5 illustrates a rocking scan of a structure in accordance with exemplary embodiments of the disclosure.

FIG. 5 illustrates a (004) rocking scan of a structure, such as structure 400. The scan illustrates discrete peaks associated with the germanium-tin layer, the germanium layer, and the silicon substrate. As illustrated, the germanium-tin peak is associated with Pendellosung fringes, indicating a high degree of crystallinity in the germanium-tin layer.

Figure 6:
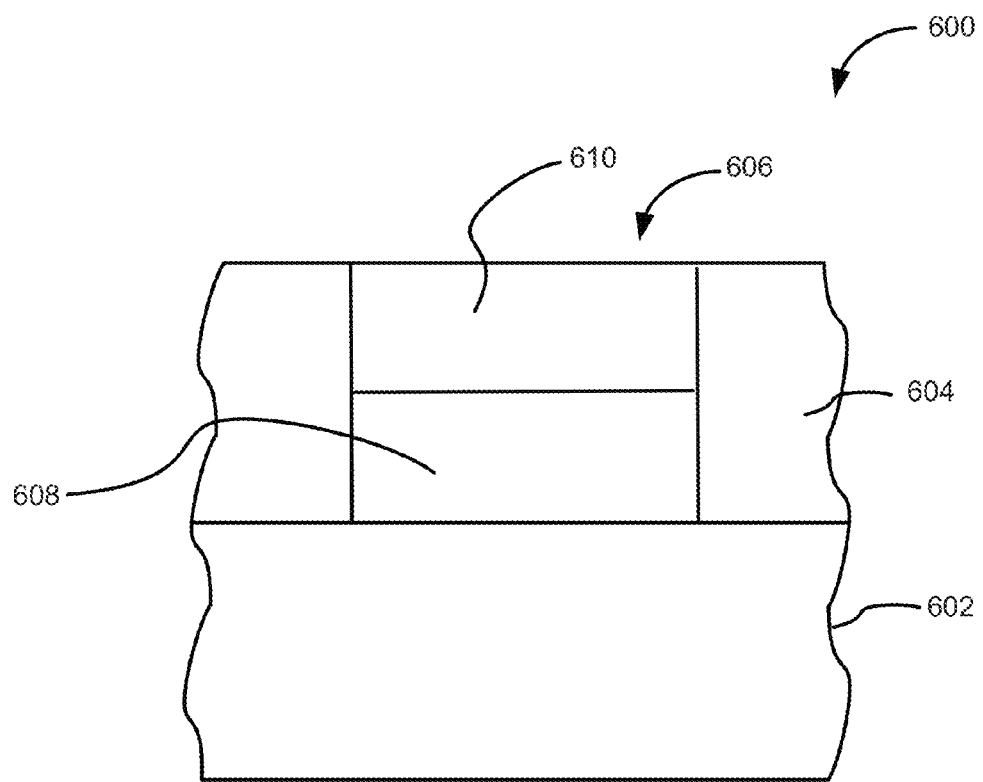
FIG. 6 illustrates another structure according to yet additional exemplary embodiments of the present disclosure.

Turning now to FIG. 6, a structure 600 in accordance with additional exemplary embodiments of the disclosure is illustrated. Structure 600 includes a substrate 602, an insulating layer 604, a via 606 formed within layer 604, a germanium layer 608 (e.g., epitaxially formed overlying substrate 602), and a germanium-tin layer 610 (e.g., epitaxially formed overlying layer 608). Layers 608 and/or 610 may be selectively formed within via 606—e.g., using method 200 or method 300.

Figure 7:
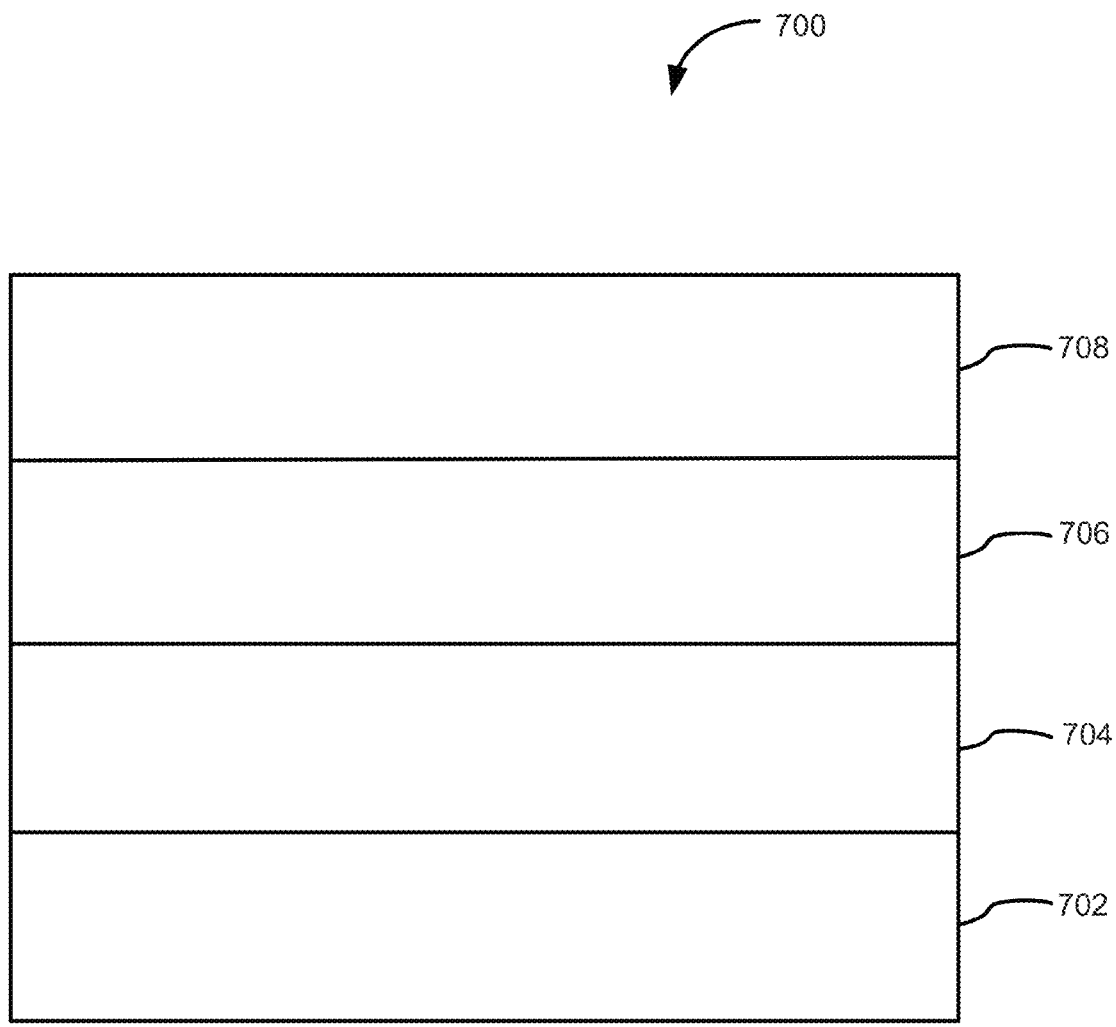
FIG. 7 illustrates yet another structure according to additional exemplary embodiments of the present disclosure.

FIG. 7 illustrates yet another structure 700 in accordance with additional embodiments of the disclosure. Structure 700 includes a substrate 702, a germanium-silicon-tin layer 704, a germanium-tin layer 706, and a germanium-silicon-tin layer 708. In the illustrated example, germanium-tin layer 706 is between two layers of germanium-silicon-tin 704 and 708. Layers 704-708 may be formed according to methods described herein. Further, although not illustrated, one or more layers 704-708 may be formed within a via of an insulating material, as described above in connection with FIG. 6.

It is to be understood that the configurations and/or approaches described herein are exemplary in nature, and that these specific embodiments or examples are not to be considered in a limiting sense. The specific routines or methods described herein may represent one or more of any number of processing strategies. Thus, the various acts illustrated may be performed in the sequence illustrated, performed in other sequences, performed simultaneously, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

I claim:

1. A structure comprising a crystalline layer of germanium tin formed according to a method comprising the steps of: providing a gas-phase reactor; providing a substrate within a reaction chamber of the gas-phase reactor; and selectively forming a crystalline layer comprising germanium tin within a via formed within an insulating layer and on a surface of the substrate using one or more precursors comprising germane, wherein the germanium tin layer is between two layers of germanium silicon tin.

2. The structure of claim 1, wherein the one or more precursors comprise a tin precursor selected from the group consisting of: $SnCl_4$, $SnD_4$, and a methyl and/or halide substituted stannate.

3. The structure of claim 1, wherein the one or more precursors comprise a silicon precursor selected from the group consisting of: disilane, trisilane, tetrasilane, and neopentasilane.

4. The structure of claim 1, wherein the crystalline layer comprising germanium tin comprises about 2 at % to about 15 at % tin.

5. The structure of claim 1, wherein during the step of selectively forming, a ratio of a tin precursor to the germane is less than 0.05.

6. The structure of claim 1, wherein the substrate comprises a layer comprising germanium overlying silicon.

7. The structure of claim 1, wherein the two layers of germanium silicon tin comprise from about 1 at % to about 20 at % silicon.

8. The structure of claim 1, wherein the substrate comprises a layer comprising germanium silicon tin overlying silicon.

9. A structure comprising a crystalline layer of germanium tin, formed according to a method comprising the steps of: providing a gas-phase reactor; providing a substrate within a reaction chamber of the gas-phase reactor; and forming a crystalline layer comprising germanium tin on a surface of the substrate using one or more precursors comprising germane, wherein the germanium tin layer is between two layers of germanium silicon tin.

10. The structure of claim 9, wherein the one or more precursors comprise a tin precursor selected from the group consisting of: $SnCl_4$, $SnD_4$, and a methyl and/or halide substituted stannate.

11. The structure of claim 9, wherein the one or more precursors comprise a silicon precursor selected from the group consisting of: disilane, trisilane, tetrasilane, and neopentasilane.

12. The structure of claim 9, wherein the crystalline layer comprising germanium tin comprises about 2 at % to about 15 at % tin.

13. The structure of claim 9, wherein during the step of selectively forming, a ratio of a tin precursor to the germane is less than 0.05.

14. The structure of claim 9, wherein the substrate comprises a layer comprising germanium overlying silicon.

15. The structure of claim 9, wherein one or both of the two layers of germanium silicon tin comprise from about 1 at % to about 20 at % silicon.

16. The structure of claim 9, wherein the substrate comprises a layer comprising germanium silicon tin overlying silicon.

17. A method of forming a structure comprising a germanium-tin layer, the method comprising the steps of: providing a gas-phase reactor; providing a substrate within a reaction chamber of the gas-phase reactor; forming a crystalline layer comprising germanium tin on a surface of the substrate using one or more precursors comprising germane, wherein the germanium tin layer is between two layers of germanium silicon tin.

18. The method of claim 17, wherein the step of forming a crystalline layer comprising germanium tin comprises selectively forming the crystalline layer comprising germanium tin within a via within an insulating material.

19. The method of claim 17, wherein the germanium tin layer comprises from about 2 at % tin to about 15 at % tin.

20. The method of claim 17, wherein one or both of the two layers of germanium silicon tin comprise from about 1 at % to about 20 at % silicon.

* * * * *